United States Patent
Pradelles et al.

(10) Patent No.: US 11,269,007 B2
(45) Date of Patent: Mar. 8, 2022

(54) METHOD FOR DIAGNOSING A BIAS SUPPLY FOR AN ACQUIRING SYSTEM COMPRISING A MATRIX-ARRAY INTERFACE DEVICE

(71) Applicants: Continental Automotive France, Toulouse (FR); Continental Automotive GmbH, Hannover (DE)

(72) Inventors: Christophe Pradelles, Fiac (FR); Amar Lounnas, Noe (FR); Jean-Claude Prouvoyeur, Saint-Jean (FR)

(73) Assignees: Continental Automotive France; Continental Automotive GmbH

( * ) Notice: Subject to any disclaimer, the term of this patent is extended or adjusted under 35 U.S.C. 154(b) by 283 days.

(21) Appl. No.: 16/340,504

(22) PCT Filed: Nov. 23, 2017

(86) PCT No.: PCT/FR2017/053223
§ 371 (c)(1),
(2) Date: Apr. 9, 2019

(87) PCT Pub. No.: WO2018/096275
PCT Pub. Date: May 31, 2018

(65) Prior Publication Data
US 2019/0242945 A1 Aug. 8, 2019

(30) Foreign Application Priority Data
Nov. 23, 2016 (FR) ...................................... 1661388

(51) Int. Cl.
*G01R 31/317* (2006.01)
*G01R 31/40* (2020.01)
*G05B 23/02* (2006.01)

(52) U.S. Cl.
CPC ..... *G01R 31/31721* (2013.01); *G01R 31/317* (2013.01); *G01R 31/40* (2013.01); *G05B 23/0221* (2013.01)

(58) Field of Classification Search
CPC ............ G01R 31/31721; G01R 31/317; G01R 31/2829; G01R 31/40; G01R 31/318516; G05B 23/0221
See application file for complete search history.

(56) References Cited

U.S. PATENT DOCUMENTS 5,177,483 A 1/1993 Boutigny et al.
5,912,482 A * 6/1999 Morimoto ......... H01L 27/14843
257/232

(Continued)

FOREIGN PATENT DOCUMENTS

EP 0351900 A2 1/1990
EP 0509360 A1 4/1992

(Continued)

OTHER PUBLICATIONS

Voltage follower circuit diagram, EEEGUIDE, 2014 (Year: 2014).*

(Continued)

*Primary Examiner* — Catherine T. Rastovski
*Assistant Examiner* — Aeysha N Sultana
(74) *Attorney, Agent, or Firm* — RatnerPrestia

(57) ABSTRACT

A method for diagnosing a bias power supply for an acquisition system including a matrix-array interface device having conductive rows and columns, each row being connected to an input port and to a bias power supply, each column being selectively connected to ground by controlling an output port, and at each intersection either a circuit or a shunt, connected between the intersected row and the intersected column, including the following steps: controlling an output port so as to ground a shunt, reading the input port (Continued)

corresponding to the shunt, a low state indicating a normal presence of the power supply, a high state indicating an abnormal absence.

9 Claims, 1 Drawing Sheet

(56) References Cited

U.S. PATENT DOCUMENTS

| | | | |
|---|---|---|---|
| 6,268,711 B1* | 7/2001 | Bearfield | H02J 7/36 320/117 |
| 6,714,019 B2 | 3/2004 | Kiribayashi et al. | |
| 9,908,487 B2 | 3/2018 | Pradelles et al. | |
| 2002/0125890 A1* | 9/2002 | Kiribayashi | G01R 31/2829 324/525 |
| 2004/0140779 A1* | 7/2004 | Diesner | H02P 5/69 318/34 |

FOREIGN PATENT DOCUMENTS

| | | |
|---|---|---|
| FR | 2821932 A1 | 9/2002 |
| FR | 3024794 A1 | 2/2016 |
| WO | 2007090772 A2 | 8/2007 |

OTHER PUBLICATIONS

Oskay ("Basics:Introduction to Zener Dioeds", Jan. 12, 2012) (Year: 2012).*

International Search Report and Written Opinion for International Application No. PCT/FR2017/053223, dated Apr. 6, 2018—9 pages.

* cited by examiner

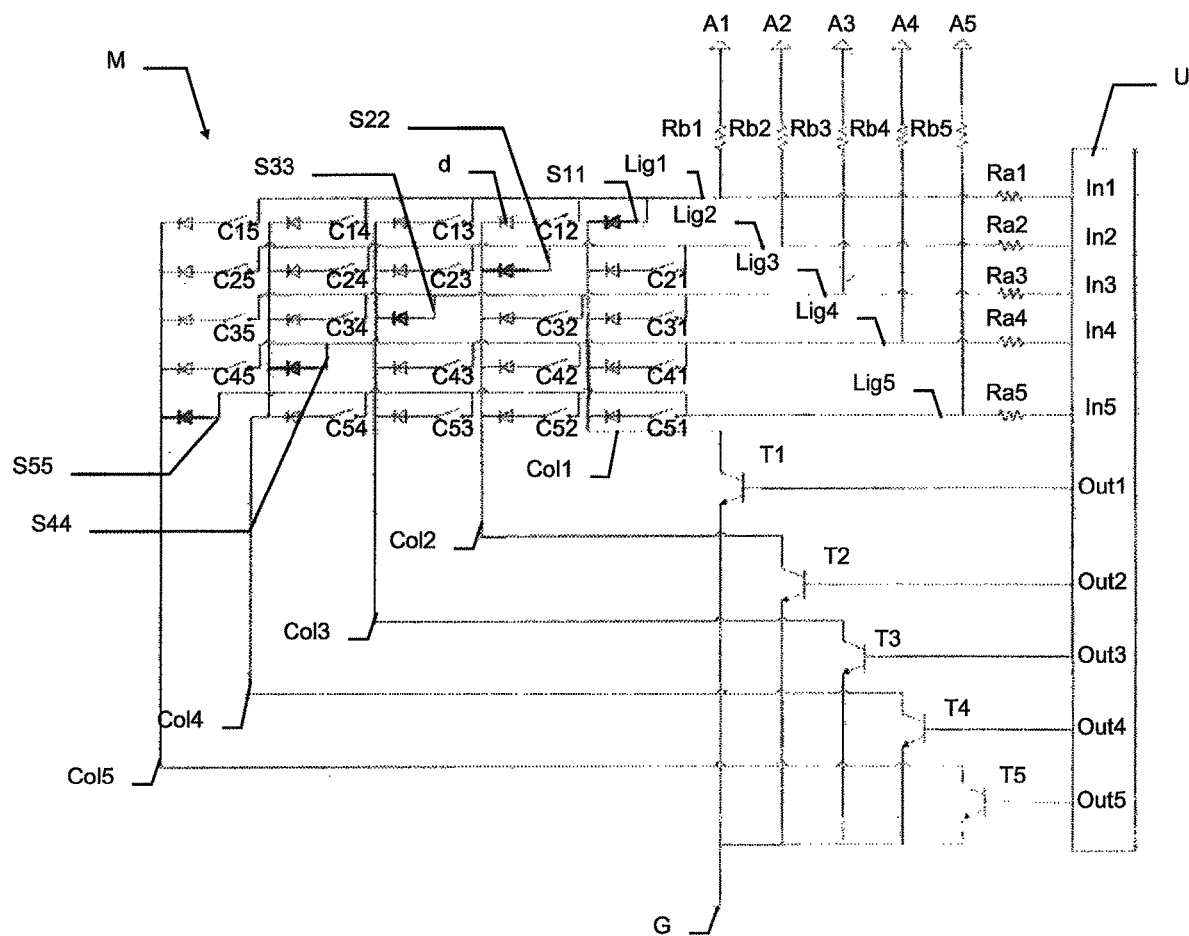

METHOD FOR DIAGNOSING A BIAS SUPPLY FOR AN ACQUIRING SYSTEM COMPRISING A MATRIX-ARRAY INTERFACE DEVICE

CROSS REFERENCE TO RELATED APPLICATIONS

This application is the U.S. National Phase Application of PCT International Application No. PCT/FR2017/053223, filed Nov. 23, 2017, which claims priority to French Patent Application No. 1661388, filed Nov. 23, 2016, the contents of such applications being incorporated by reference herein.

FIELD OF THE INVENTION

The present invention relates to a method for diagnosing a bias power supply for an acquisition system comprising a matrix-array interface device.

BACKGROUND OF THE INVENTION

In the field of acquiring the state value of a circuit, it is known to use a matrix-array interface device. Such a device is advantageous for multiplexing circuits over time, typically logic (all or nothing) circuits, whose state varies on average less quickly than the repetition of acquisition, and which may thus be acquired at different times.

A matrix-array device comprising n rows and m columns makes it possible to interface n×m circuits. Interfacing it with a processing unit requires only n input ports and m output ports. It is possible to observe a certain saving in terms of the number of useful ports by comparing these n+m ports with the n×m input ports that a conventional assembly, with each circuit interfaced by way of an input port, would require.

A matrix-array device is also advantageous in that it allows a significant reduction in the size of the harnesses. An advantageous arrangement, as close as possible to the circuits, makes it possible to replace a harness interfacing up to n×m circuits, and comprising 2×n×m wires, with an interface harness between the matrix-array device and the processing unit comprising n+m wires.

Therefore, such a matrix-array device is commonly used in industry, and more particularly in the automotive sector.

SUMMARY OF THE INVENTION

To understand aspects of the invention, it seems useful beforehand to recall the principles of such a matrix-array device and its operation. This is proposed with reference to the FIGURE.

It is desired to interface a plurality of circuits C12, C13, C14, C15, C21, C23, C24, C25, C31, C32, C34, C35, C41, C42, C43, C45, C51, C52, C53, C54 with a processing unit U, for the purpose of acquiring the state value of each of these circuits, which is generically denoted Cij.

In the remainder of the present document, the following index notations are used:

n denotes the number of rows
m denotes the number of columns
i is a common index that runs through the rows and varies between 1 and n, this being denoted i=1 . . . n
j is a common index that runs through the columns and varies between 1 and m, this being denoted j=1 . . . m
k, k1, k2 are variable indices in 1 . . . n that denote a particular row
l is a variable index in 1 . . . m that denotes a particular column.

An element E is indexed Ei or Ej or Eij depending on whether a vector or matrix-array element is involved. When there are two indices, the first index denotes the row and the second index denotes the column. Thus, for example, Outj generically denotes any output port (Out) in the set of output ports, where j=1 . . . m. In this case, where m=5, Outj is a shortened succinct notation equivalent to: Out1, Out2, Out3, Out4, Out5.

A matrix-array device M comprises n, in this case equal to 5, conductive rows Ligi, for i=1 . . . n, and m, in this case equal to 5, conductive columns Colj, for j=1 . . . m. These conductive rows Ligi and columns Colj are positioned in a matrix array and thus form n×m intersections Xij, that is to say in this case 5×5=25 intersections.

Each row Ligi is connected to an input port Ini of the same index, for i=1 . . . n, of the processing unit U. In addition, each row Ligi is connected to a power supply Ai, of the same index, for i=1 . . . n, which ensures biasing. It may be seen that there are as many input ports Ini, respectively as many power supplies Ai, that is to say n, as there are rows Ligi of the matrix-array device M.

Each column Colj is selectively connected to ground G. This means that said column Colj may or may not be connected to ground G. This selectivity depends on the control state of an output port Outj, of the same index, for j=1 . . . m, of the processing unit U. When the jth output port Outj is controlled, the jth column Outj is connected to ground G. When the jth output port Outj is not controlled, the jth column Outj is not connected to ground G. It may be seen that there are as many output ports Outj, that is to say m, as there are columns Colj of the matrix-array device M.

A circuit Cij whose state value it is desired to acquire is positioned at an intersection Xij between the ith row Ligi and the jth column Colj. A circuit Cij comprises a dipolar assembly having, in series, at least one component able to change state. This component is typically all or nothing. Its state may then be: open or closed, on state or off state. This is shown symbolically by a switch Cij. A circuit Cij comprises two poles or terminals. The first terminal is connected to the intersected row, that is to say the ith row Ligi for the intersection Xij, and the second terminal is connected to the intersected column, that is to say the jth column Colj for the intersection Xij.

Due to the wiring of the matrix-array device M, the first terminal of the circuit Cij is connected to an input port, in this case the ith one Ini, via the ith row Ligi, and the second terminal of the circuit Cij is selectively connected to ground G, depending on the control state of the jth output port Outj. The ith row Ligi is biased by the ith power supply Ai. Therefore, when the jth output port Outj is controlled and connects the jth column Colj to ground G, the ith input port Ini sees a zero voltage or a logic state of value "0" or a low state when the circuit Cij is closed, and a nonzero voltage or a logic state of value "1" or a high state when the circuit Cij is open. Reading or acquisition performed by the ith input port Ini thus provides a value that makes it possible to ascertain the state of the circuit Cij.

By controlling the lth output port Outl, it is possible, by performing acquisitions on the n input ports Ini, to respectively ascertain the state of each of the circuits Cil of the lth column Coll. By repeating the operation, by successively controlling each of the output ports Outj one at a time, it is possible to ascertain the state of all of the circuits Cij connected to the matrix-array device M.

As described up until now, a matrix-array device M of size n×m makes it possible to connect up to n×m circuits Cij.

However, as is known, it is advantageous to substitute, at some intersections Xij, a circuit Cij with a shunt Sij directly connecting the intersected row Ligi and the intersected column Colj. To be effective, such a substitution should be such that there is at most one shunt Sij per row and at most one shunt Sij per column. Numerous configurations complying with the above dual rule of singularity are possible. For example, as shown in the FIGURE, shunts are positioned on the diagonal of the matrix-array device M, that is to say one shunt Sii on each intersection Xii (Xij, where i=j).

A shunt Skl is advantageous in terms of operational safety. It makes it possible to check the correct operation of an associated given input port Ink or the correct operation of an associated output port Outl, and the continuity of the matrix-array device M at the kth row Ligk and the lth column Coll. Thus, reading the input port Ink, when the corresponding output port Outl, that is to say the output port Outl connected by the shunt Skl, is controlled, should indicate a "0" or low state, and reading the input port Ink, when the output port Outl is not controlled, should indicate a "1" or high state, if the input port Ink, the output port Outl, the row Ligk and the column Coll are operational. Any other behavior is indicative of a fault with one of these elements.

A shunt Sij makes it possible to test an input port Ini and an output port Outj. It is therefore advantageous to have at least one shunt Sij per row Ligi, that is to say n shunts, and/or at least one shunt Sij per column Colj, that is to say m shunts. However, each shunt Sij eliminates a circuit Cij. Therefore, a matrix-array device M thus modified by shunts makes it possible to interface only n×m−n circuits Cij (if n<=m) or n×m−m (if m<=n).

Advantageously, a matrix-array interface device M has a square size, that is to say n=m.

Outside of the intersections Xij and the connections that are formed there, via circuits Cij or via shunts Sij, such as described above, the conductive rows Ligi and columns Colj are isolated from one another.

A state value of at least one circuit Cij, and advantageously state values of all of the circuits Cij, may be acquired in line with the following steps: controlling an output port Outl, the effect of which is to ground G the circuits Cil and the shunt Skl of the column Coll associated with this output port Outl, that is to say the circuits Cil, for i=1 . . . k−1, k+1 . . . n, assuming, by convention, that the shunt Skl of the lth column Coll is on the intersection Xkl with the kth row Ligk. In this configuration, reading each of the input ports Ini, for i=1 . . . k−1, k+1 . . . n, corresponding to a circuit Cil, for i=1 . . . k−1, k+1 . . . n, that is to say all of the input ports apart from the kth one corresponding to the shunt Skl, respectively makes it possible to acquire the state value of the corresponding circuit Cil. By repeating the operation for each of the output ports Outj, where j=1 . . . m, the state value of all of the circuits Cij interfaced with the matrix-array device M is obtained.

An increasing demand in terms of operational safety, as stipulated for the automotive sector by standard ISO 26262, is nowadays leading to the addition of a check of the correct operation of the bias power supplies Ai to such an acquisition system. This requires the addition of reread input ports in order to diagnose the presence of the bias power supplies Ai for the resistors of the circuits for matching the active inputs at ground.

In the majority of control modules, such as BCMs (for "body control module"), there are two bias power supplies: one power supply for biasing the inputs that are able to awake the product and one power supply for biasing the inputs that do not awake the product.

In terms of safety, as defined by standard ISO 26262, diagnosing the bias power supplies Ai has to include all of the contacts of the matrix-array interface device M and all of the active inputs at ground.

One obvious response to this problem that is used nowadays consists in adding an additional input port Ini for each power supply Ai. However, such a response brings about a detrimental extra cost.

The invention proposes an alternative solution, by advantageously noting that the state read by an input port Ini corresponding to a shunt Sij is indicative of the operation of the associated bias power supply Ai. Specifically, in the absence of a circuit Cij, the state thus read is not dependent on the state, which may vary, of a circuit Cij. The invention thus addresses the problem of diagnosing power supplies by way of just a software-based modification, without requiring any addition of hardware.

The subject of the invention is a method for diagnosing a bias power supply for an acquisition system comprising a processing unit and a matrix-array interface device comprising a first number of conductive rows, a second number of conductive columns, each row being connected to an input port of the processing unit and to a bias power supply, each column being selectively connected to ground by controlling an output port of the processing unit, and at each intersection between a row and a column either a circuit one terminal of which is connected to the intersected row and another terminal of which is connected to the intersected column or a shunt connecting the intersected row and the intersected column, so as to have at most one shunt per row and per column, comprising the following steps:

controlling an output port so as to ground a column and the shunt that are associated therewith, and reading the input port corresponding to said shunt, a low state indicating a normal presence of the power supply associated with the row including the shunt, a high state indicating an abnormal absence.

According to another feature, the method also comprises the following steps:

stopping the control of said output port, and reading the input port corresponding to said shunt, a low state indicating an abnormal presence of the power supply associated with the row including the shunt, a high state indicating a normal absence.

According to another feature, acquiring the state values of the circuits comprises the following steps:

controlling an output port so as to ground a column and thus the circuits of the column and the associated shunt, reading each of the input ports corresponding to a circuit so as to acquire the state value of said circuit, and stopping the control of the output port, these steps being reiterated for all of the output ports, wherein the steps of reading the input port corresponding to a shunt are inserted so as to reuse the control operations, and possibly the operations of stopping the control, of the various output ports.

According to another feature, at least two rows are connected to one and the same power supply, and the method also comprises a step of comparing the readings of the input port corresponding to one of the two rows and the readings of the input port corresponding to the other of the two rows, a match indicating normal operation of the power supply, a mismatch indicating short-circuiting of the power supply.

According to another feature, each circuit or shunt is connected to its column via a diode oriented so as to prevent a current from flowing from ground.

According to another feature, each row is connected to its input port via a resistor.

According to another feature, each power supply is connected to its row via a resistor.

According to another feature, each column is selectively connected to ground via a transistor controlled by an associated output port.

BRIEF DESCRIPTION OF THE DRAWINGS

The detailed description is given with reference to the drawings, in which:

The FIGURE illustrates the interface between a plurality of circuits to be acquired and a processing unit via a 5×5 matrix-array device.

DETAILED DESCRIPTION OF THE PREFERRED EMBODIMENTS

Other features, details and advantages of aspects of the invention will become more clearly apparent from the detailed description below.

It is possible to perform a diagnosis that checks the presence and the correct operation of a bias power supply Ak for such an acquisition system comprising a processing unit U and a matrix-array device M.

To this end, the input port Ink corresponding to a shunt Skl is read. If, as is the case in one advantageous configuration of the matrix-array device M, a shunt Skl is present on the row k, it is necessarily a single shunt and it is positioned on a column that will be denoted as the lth one, that is to say Coll.

Therefore, if the lth output port Outl is controlled during reading of the input port Ink corresponding to the shunt Skl, the shunt Skl is grounded via its column Coll and connected to the power supply Ak via its row Ligk. Therefore, if the power supply Ak is normally present, the input port Ink should see a low state. If a high state is seen, it is indicative of a fault, and indicates an absence of the power supply Ak.

This may be performed for each of the shunts Sij, and thus provide a diagnosis of the presence of each of the power supplies Ai connected to a row Ligi comprising a shunt Sij.

Additionally, after stopping the control of said output port Outl, the input port Ink corresponding to a shunt Skl may be read. For this reading, a high state indicates a presence of the power supply Ak associated with the row Ligk including the shunt Skl, and therefore a fault possibly being linked to a short circuit, whereas, by contrast, a low state indicates a normal absence of said power supply Ak.

The acquisition method according to the prior art, as described above, performs the acquisitions in series for the input ports Ini, when an output port Outl is controlled. However, according to the prior art, the acquisition of the input port Ink corresponding to a shunt Skl, since it does not correspond to a circuit Cij, was either not performed or unused.

It may be noted that the acquisition method, as described above, controls and then stops each of the output ports Outj in sequence, one at a time. Therefore, according to one advantageous embodiment, this control and stoppage of the output ports Outj may be exploited by reusing them for the diagnostic method by inserting the readings of the input ports Ink corresponding to a shunt Skl, the diagnostic method then benefiting from the times at which an output port Outk is either controlled or not controlled.

Therefore, during the acquisitions performed in series for the input ports Ini when the output port Outl is controlled, the acquisition of the input port Ink corresponding to the shunt Skl, which, since it does not correspond to a circuit Cij, was either not performed or unused before, becomes relevant according to the invention in that it allows a diagnosis of the presence of the corresponding power supply Ak.

Thus, when a column Coll is connected to ground G, the reading of the input port Ink corresponding to a shunt Skl may advantageously be performed at the same time as the reading of the other input ports Ini, for i=1 . . . k−1, k+1 . . . n corresponding to a circuit Cil, for i=1 . . . k−1, k+1 . . . n.

Therefore, the acquisitions may be performed for all of the input ports Ini, for i=1 . . . n, which may be advantageous on certain processing units U that prefer grouped readings.

Reading of the input port Ink corresponding to a shunt Skl when the corresponding column Coll is not connected to ground G should be performed at another time, typically during the acquisition of another column.

According to one common embodiment, one and the same power supply Ai may be used to bias several rows Ligi. There is thus no particular need for separation, and one and the same power supply Ak may bias all of the rows Ligi. As an alternative, one common embodiment consists in using a first power supply for biasing the circuits Cij that are able to awake the processing unit U and a second power supply for biasing the circuits Cij that do not awake the processing unit U. The circuits Cij are then grouped together on one and the same row Ligi, according to their type in relation to the awakening operation. Given the number of circuits, there are more often than not at least two rows for each of the two power supplies.

Provided that one and the same power supply Ak is used to bias at least two rows Ligk1, Ligk2 of the matrix-array device M, it is possible to add another diagnosis of this common power supply Ak. Specifically, the above diagnostic test or tests may be performed for the first row Ligk1. The reading of the input port Ink1 associated with the row Ligk should normally indicate a low state when the column l comprising a shunt Sk1l for said row Ligk1 is grounded G, and a high state if not. Likewise, the reading of the input port Ink2 associated with the row Ligk2 should normally indicate a low state when the column l comprising a shunt Sk2l for said row Ligk2 is grounded G, and a high state if not. The two rows Ligk1 and Ligk2 connected to one and the same power supply Ak should match in that they have comparable states depending on the controls of their associated output port Outl. If such a match is present, it may be considered that the power supply Ak is operating normally. If a mismatch is detected, the power supply exhibits faulty operation, probably linked to a short circuit in relation to one or the other of the rows Ligk1, Ligk2, typically at ground G.

To protect the output ports Outj, the matrix-array device M comprises, for each circuit Cij or shunt Sij, a diode d positioned between said circuit Cij or said shunt Sij and its associated column Colj. Said diode d is oriented so as to prevent a current from flowing from ground G. This is illustrated the FIGURE.

According to another feature, each row Ligi, for i=1 . . . n, is connected to its input port Ini, for i=1 . . . n, via a first resistor Rai, for i=1 . . . n. This is illustrated in the FIGURE.

According to another feature, each power supply Ai, for i=1 . . . n, is connected to its row Ligi, for i=1 . . . n, via a second resistor Rbi, for i=1 . . . n. This is illustrated in the FIGURE.

The connection of a column Colj, for j=1 . . . m, may be selectively connected to ground G by way of a transistor Tj, for j=1 . . . m. This transistor Tj is controlled by the associated output port Outj, for j=1 . . . m. This is illustrated in the FIGURE.

The invention claimed is:

1. A method for diagnosing a bias power supply for an acquisition system comprising a processing unit and a matrix-array interface device comprising a first number of conductive rows, a second number of conductive columns, each row being connected to an input port of the processing unit and to a bias power supply, each column being selectively connected to ground by controlling an output port of the processing unit, each row intersecting a respective one of each column to form a plurality of intersections, a respective circuit of a plurality of circuits at each of the plurality of intersections, one terminal of each respective circuit is connected to the intersected row and another terminal of each respective circuit is connected to the intersected column, and a respective shunt of a plurality of shunts connecting the intersected row and the intersected column, so as to have one shunt per row and per column, the method comprising:
controlling an output port so as to ground a selected column of the columns via a selected shunt of the plurality of shunts; and
reading the input port corresponding to said selected shunt:
a low state reading at the input port indicating a normal presence of the power supply associated with the row including the selected shunt, and
a high state reading at the input port indicating an abnormal absence of the power supply.

2. The method as claimed in claim 1, further comprising:
stopping the control of said output port, and
reading the input port corresponding to said selected shunt, a low state indicating an abnormal presence of the power supply associated with the row including the selected shunt, a high state indicating a normal absence.

3. The method as claimed in claim 1, wherein the controlling and reading steps are repeated for each of the columns.

4. The method as claimed in claim 1, wherein at least two rows of the rows are connected to one and the same power supply, and the method also comprises comparing the readings of the input port corresponding to one of the two rows and the readings of the input port corresponding to the other of the two rows, a match indicating normal operation of the power supply, a mismatch indicating short-circuiting of the power supply.

5. The method as claimed in claim 1, wherein each respective circuit and each respective shunt is connected to its column via a diode oriented so as to prevent a current from flowing from ground.

6. The method as claimed in claim 1, wherein each row is connected to its input port via a resistor.

7. The method as claimed in claim 1, wherein each power supply is connected to its row via a resistor.

8. The method as claimed in claim 1, wherein each column is selectively connected to ground via a transistor controlled by an associated output port.

9. The method as claimed in claim 2, wherein the stopping and reading steps are repeated for each of the columns.

* * * * *